United States Patent [19]

Ugajin et al.

[11] Patent Number: 5,294,807
[45] Date of Patent: Mar. 15, 1994

[54] QUANTUM EFFECT DEVICE IN WHICH CONDUCTION BETWEEN A PLURALITY OF QUANTUM DOTS OR WIRES IS ACHIEVED BY TUNNEL TRANSITION

[75] Inventors: Ryuichi Ugajin; Kenji Funato, both of Kanagawa, Japan

[73] Assignee: Sony Corporation, Tokyo, Japan

[21] Appl. No.: 894,580

[22] Filed: Jun. 5, 1992

[30] Foreign Application Priority Data

Jun. 7, 1991 [JP] Japan ................... 3-162519

[51] Int. Cl.$^5$ ............... H01L 29/161; H01L 29/205
[52] U.S. Cl. .......................... 257/14; 257/12; 257/17; 257/94
[58] Field of Search .............. 257/12, 13, 14, 17, 257/96, 94, 183

[56] References Cited

U.S. PATENT DOCUMENTS

| 4,799,091 | 1/1989 | Reed | 257/25 |
| 4,802,181 | 1/1989 | Iwata | 257/15 |
| 4,983,540 | 1/1991 | Yamaguchi et al. | 257/15 |
| 5,016,990 | 5/1991 | Dobson | 257/189 |
| 5,070,375 | 12/1991 | Sakai | 257/15 |
| 5,073,893 | 12/1991 | Kondou | 257/15 |
| 5,126,804 | 6/1992 | Nagai et al. | 257/21 |
| 5,182,788 | 1/1993 | Tanaka | 257/14 |

FOREIGN PATENT DOCUMENTS

| 0427905 | 5/1991 | European Pat. Off. | 257/13 |
| 2-33972 | 2/1990 | Japan | 257/14 |
| 2-154479 | 6/1990 | Japan | 257/21 |

OTHER PUBLICATIONS

Article "Negative transconductance and negative differential resistance in a grid-gate modulation-doped field-effect transistor" Applied Phys. Lett., 54(5), 30 Jan. 1989, Ismail et al.

Article "Quantum Wire Superlattices and Coupled Quantum Box Arrays: A Novel Method to Suppress Optical Phonon Scattering in Semiconductors", published in Japanese Journal of Appl. Phys., vol. 28, No. 2, Feb. 1989, pp. L314–L316, Sakaki.

Primary Examiner—Rolf Hille
Assistant Examiner—Minhloan Tran
Attorney, Agent, or Firm—Hill, Steadman & Simpson

[57] ABSTRACT

In quantum effect devices using quantum dots, a novel quantum effect device which controls the probability of tunnel transition of electrons among quantum dots to obtain quantum effects such as band gap modulation. i-GaAs layers serving as the quantum dots are formed on an n-AlGaAs substrate and, further, n-AlGaAs layers are formed as electron supply layers on the i-GaAs layers. By this double heterojunction structure, channels are formed in the i-GaAs layers near the two junction surfaces sandwiching the layers. On the other hand, a potential barrier layer comprised of an i-AlGaAs layer with a small barrier height with respect to the quantum dots and an SiO$_2$ layer with a large barrier height laminated together is formed between the quantum dots. The position of the lamination interface in the potential barrier layer is set to a height enabling the two layers to contact the quantum dots. The magnitude of the electric field applied from the control electrode to the quantum dots is used to select one of the two channels. The band gap changes according to the change of the probability of tunnel transition at this time. If the change in the band gap is, for example, converted to a change in light emission wavelength, a variable wavelength type semiconductor laser device can be constructed.

12 Claims, 6 Drawing Sheets

POTENTIAL AT LINE II-II

POTENTIAL AT LINE III-III

POTENTIAL AT LINE IV-IV

QUANTUM EFFECT DEVICE IN WHICH CONDUCTION BETWEEN A PLURALITY OF QUANTUM DOTS OR WIRES IS ACHIEVED BY TUNNEL TRANSITION

BACKGROUND OF THE INVENTION

1. Field of the Invention

The present invention relates to a quantum effect device using quantum wires or quantum dots.

2. Description of the Related Art

In general, the oscillation wavelength of a semiconductor LED determined by the magnitude of the band gap. This band gap is a constant intrinsic to a substance, so it is difficult to fabricate a device with a variable wavelength using a semiconductor LED.

A new semiconductor device drawing attention, however, is a quantum effect device which uses quantum wires or quantum dots. In this device, electrons are confined in fine wires or small dots formed at intervals of about the quantum-dynamic wavelength of the electrons and utilize the electron behavior according to the quantum level of the quantum well. Examples of application of quantum wires or quantum dots to laser devices are also known. One example of such a device uses quantum wires as the active layer of a quantum well laser. The phenomenon of spatial isolation of electron-hole pairs and the restraining of the light emission process, resulting in a sharp drop in the light output, by application of an electric field to a quantum well is also known.

In such types of quantum effect devices, quantum wires and quantum dots arrayed at extremely fine intervals are used, and its operation is based on the intrinsic quantum size effect.

However, when preparing a new device which smashes existing ideas and enables change of the light emission wavelength, the desired operation cannot be obtained just by forming a gate electrode for control of the modulation.

SUMMARY OF THE INVENTION

The present invention, in consideration of the above technical problem, has as its object the provision of a quantum effect device which can exhibit a new quantum effect.

The quantum effect device of the present invention is characterized in that conduction between a plurality of quantum dots or a plurality of quantum wires arrayed on a substrate is achieved by tunnel transition, provision is made of an electroconductive film for applying a variable electric field to the quantum wires or the quantum dots, and the probability of tunnel transition between the quantum wires or quantum dots is controlled by the electric field given from the electroconductive film.

Here, the above-mentioned quantum wires or quantum dots are fine regions for confining, two dimensionally or three dimensionally, carriers such as electrons or holes. The interval between the adjoining quantum wires or quantum dots is made about the quantum dynamic wavelength (de Broglie wavelength). As an example of the control of the probability of tunnel transition, an electric field from the electroconductive film may be used for control so that selective conduction is achieved in regions of different heights of potential barriers existing between the quantum wires or the quantum dots.

In the quantum effect device of the present invention, the probability of tunnel transition between quantum wires or quantum dots is changed by the electric field from the electroconductive film. Therefore, it is possible, for example, to obtain a band gap modulation or other quantum effect.

In the band structure of a conduction band of a bulk semiconductor, as shown in the energy band diagram of FIG. 1a (diagram of relationship between electron energy E and wave number k of electrons), the quantum level degenerates. Here, considering this based on the tight binding model, the band width $W_A$ of the bulk crystal is proportional to the amplitude of transition $t_A$ between the lattice points.

On the other hand, the quantum effect device of the present invention is comprised of an array of quantum wires or an array of quantum dots, so the quantum level is split by the tunnel effect as shown in FIG. 1b and subbands (or minibands) set apart by forbidden bands are formed. The subband width at this time becomes, successively, $w_1$, $w_2$, and $w_3$ from the low energy side. The band width $w_i$ of the i-th subband can be made to change in proportion to the amplitude of transition to by changing the probability of tunnel transition between the quantum wires or the quantum dots by the field effect from the electroconductive film and thus changing the amplitude of transition $t_Q$.

Here, by 0-th approximation, the center of the band may be considered to remain unchanged, so the band gap Eg changes due to the change of the subband width $w_i$. FIGS. 2a and 2b are energy band diagrams for explaining the change. The 1-st subband of the conduction band of FIG. 1b is enlarged and shown together with the topmost portion of the band of the valence band. The subband width $w_1$ shown in FIG. 2a becomes narrower as shown in FIG. 2b and if becoming $w_1'$, the band gap Eg increases. The change in the band gap Eg leads to a change in the light emission wavelength in the case of application of the quantum effect device of the present invention to, for example, an LED.

That is, if the system producing these changes in the band gap is used and a p-n junction is formed, then it becomes possible to obtain a quantum effect device with a light emission wavelength which can be varied by modulation of the band gap. Here, if the size L of the quantum dot is N times the lattice constant a (L=Na), N number of subbands are obtained. The total band width W of the N number of subbands is a constants amount determined by the amplitude of transition $t_A$ between lattice points, so the subband width $w_i$ satisfies the relationship of $w_i \leq W/N$. That is, the variable width of the band gap Eg becomes about the subband width $w_i$. Therefore, the smaller the size L of the quantum dots, the larger the $w_i$ and greater a variable width of the band gap Eg that can be obtained, so control over a wide range of wavelength becomes possible.

If the quantum effect device of the present invention is applied to an LED, then it is possible to produce a variable wavelength LED, a flat panel display, etc.

BRIEF DESCRIPTION OF THE DRAWINGS

FIGS. 1a and 1b are energy band diagrams showing the band structure of a conduction band in a semiconductor, wherein FIG. 1a shows the band structure in a bulk crystal and FIG. 1b shows the subband structure in a super lattice.

FIGS. 2a and 2b are energy band diagrams for explaining the changes in the band gap in a subband structure, wherein FIG. 2a shows the case of a large subband width and a narrow band gap and FIG. 2b the case of a small subband width and a broad band gap.

DESCRIPTION OF THE PREFERRED EMBODIMENTS

The present invention will be explained in further detail below based on specific embodiments.

The quantum effect device of the present embodiment has quantum dots comprised using an AlGaAs/GaAs compound semiconductor layer. The probability of tunnel transition between quantum dots is controlled by the bias voltage applied from the control electrode.

Figure 3:
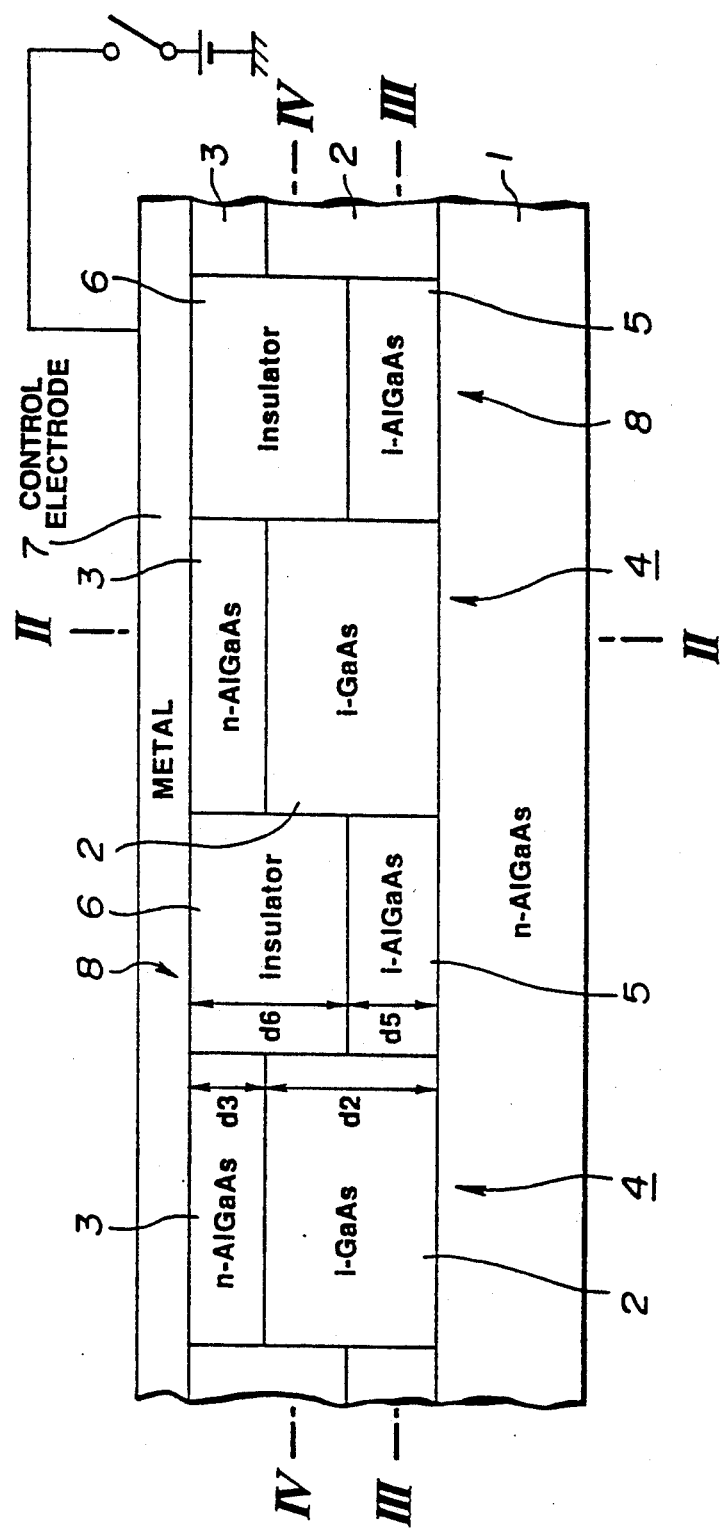
FIG. 3 is a schematic sectional view of key portions showing an example of the constitution of a quantum effect device of the present invention.

A cross-section of the key portions of the above-mentioned quantum effect device is shown in FIG. 3. On an n-AlGaAs substrate 1, there are formed a plurality of blocks 4 comprised of an undoped GaAs layer 2 (hereinafter referred to as an "i-GaAs layer 2") and an n-AlGaAs layer 3 laminated in this order. The blocks 4 are processed to substantially dice shapes and, further, are arrayed separated from each other by about the quantum dynamic distance (de Broglie wavelength) of the electrons. By this structure, electrons are confined three-dimensionally in the above-mentioned i-GaAs layers 2, which i-GaAs layers 2 function as quantum dots.

The thickness of the i-GaAs layers 2 constituting the blocks 4 is made $d_2$, while the thickness of the n-AlGaAs layers 3 is made $d_3$. As mentioned later, the probability of tunnel transition is controlled by changing the potential in the direction of thickness $d_2$. The i-GaAs layers 2 are layers with extremely little impurities and a narrow band gap. The n-AlGaAs substrate 1 and the n-AlGaAs layers 3 joined with the i-GaAs layers 2 in the thickness direction function as electron donor layers and have broad band gaps. Therefore, the interfaces of the i-GaAs layers 2 and the n-AlGaAs substrate 1 and the interfaces of the i-GaAs layers 2 and the n-AlGaAs layers 3 all become heterojunctions and a so-called double hetero structure is achieved. Potential channels where the electrons accumulate are formed at the two interfacia sides of the i-GaAs layers 2.

Between the rows of the blocks 4 is formed potential barrier layer 8 having a structure for controlling the probability of tunnel transition between the blocks 4. The potential barrier layer 8 is made a flat matrix pattern surrounding the blocks 4. The potential barrier layer 8 is made a flat matrix pattern surrounding the blocks 4. The potential barrier layer 8 has a laminate structure and is comprised of an insulating layer 6 formed on an undoped AlGaAs layer 5 (hereinafter referred to as the "i-AlGaAs layer 5"). The insulating layer 6 is comprised, for example, of $SiO_2$. Regarding the thicknesses of these layers, the insulating layer 6 is made a thickness of $d_6$ and the i-AlGaAs layer 5 is made a thickness of $d_5$. The total of the thicknesses of the insulating layer 6 and the i-AlGaAs layer 5 ($d_5+d_6$) is made substantially equal to the total of the thicknesses of the i-GaAs layers 2 and the n-AlGaAs layers 3 of the blocks 4 ($d_2+d_3$). The top surface of the n-AlGaAs layers 3 and the insulating layer 6 become substantially flat. On the flat surfaces is formed a control electrode 7 comprised of an aluminum or other metal electroconductive layer. The control electrode 7 functions to change the electric field reaching the blocks 4 by the voltage supplied to it.

Here, comparing the thicknesses of the layers constituting the blocks 4 and the potential barrier layer 8, the thickness $d_5$ of the i-AlGaAs layer 5 is made smaller than the thickness $d_2$ of the i-GaAs layers 2, and the thickness $d_6$ of the insulating layer 6 becomes larger than the thickness $d_3$ of the n-AlGaAs layers 3 by that amount. The i-AlGaAs layer 5 and the i-GaAs layers 2 are formed on a common, flat n-AlGaAs substrate 1, so the interface between the i-AlGaAs layer 5 and the insulating layer 6 in the potential barrier layer 8 becomes a position lower in height than the heterojunction surfaces of the i-GaAs layers 2 and the n-AlGaAs layers 3 in the blocks 4. Therefore, the i-GaAs layers 2 of the blocks 4 adjoin the i-AlGaAs layer 5 at the n-AlGaAs substrate 1 side and adjoin the insulating layer 6 at the control electrode 7 side. As a result, one of the two heterojunctions of the i-GaAs layers 2 adjoins the i-AlGaAs layer 5 and the other heterojunction adjoins the insulating layer 6.

Figure 4:
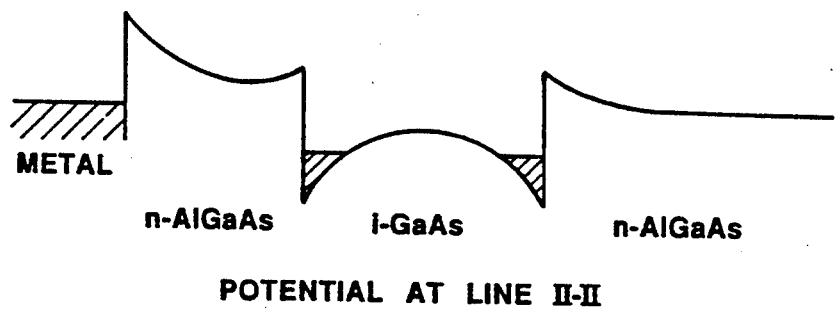
FIG. 4 is a potential diagram showing the potential pattern along line II—II in FIG. 3.

FIG. 4 shows the potential along the line II—II in FIG. 3, i.e., the direction of thickness of the blocks 4. Here, the band gaps of the n-AlGaAs layers 3 and the n-AlGaAs substrate 1 are large and the band gap of the i-GaAs layers 2 is small, so the double heterojunction structure shown in FIG. 4 is achieved. At the heterojunction surfaces at the both sides of the i-GaAs layers 2, triangular potential channels are formed. The electrons accumulating in these channels are controlled by the control electrode 7.

Figure 5:
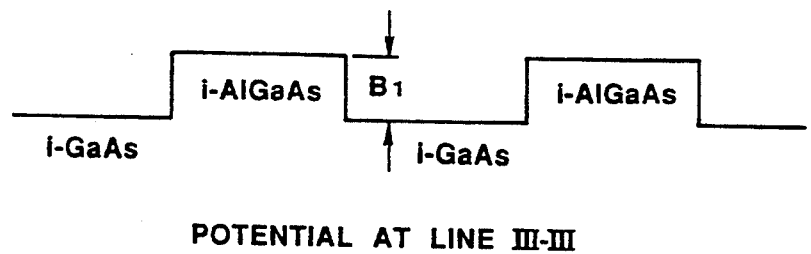
FIG. 5 is a potential diagram showing the potential pattern along the line III—III in FIG. 3.

FIG. 5 is a potential diagram showing the potential pattern along the line III—III in FIG. 3. As shown in FIG. 5, in the plane parallel to the main face of the substrate near the heterojunction at the n-AlGaAs substrate 1 side of the i-GaAs layers 2, a rising/falling potential pattern is obtained in accordance with the pattern of the blocks 4. The falling regions show the potentials of the i-GaAs layers 2, while the rising regions, that is, the regions becoming the barrier, show the potential of the i-AlGaAs layer 5. The difference in potential of the layers 2 and 5 is made the barrier height $B_1$.

Figure 6:
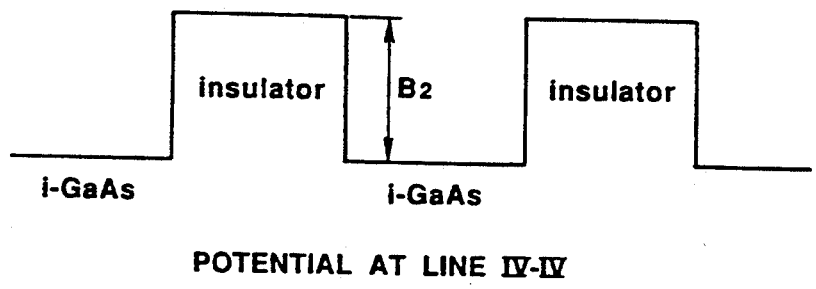
FIG. 6 is a potential diagram showing the potential pattern along the line IV—IV in FIG. 3.

FIG. 6 is a potential diagram showing the potential pattern along the line IV—IV in FIG. 3. Near the heterojunction surface at the n-AlGaAs layer 3 side of the i-GaAs layers 2, the rising regions of the potential correspond to the insulating layer 6. Therefore, the barrier height $B_2$ expressing the potential difference of the layers 2 and 6 becomes larger than the above-mentioned barrier height $B_1$. In general, when the barrier height is high, the probability of tunnel transition becomes lower, while when the barrier height is low, the probability of tunnel transition becomes higher. Therefore, in a quantum effect device having such a structure, the probability of tunnel transition from a quantum dot (that is, an i-GaAs layer 2) to the adjoining quantum dot becomes higher near the heterojunction at the n-AlGaAs substrate 1 side compared with near the heterojunction at the n-AlGaAs layer 3 side even in the same i-GaAs layer 2. Therefore, the band gap of the subband changes in accordance with the change in the amplitude of transition at this time and a quantum effect is obtained.

Figure 7:
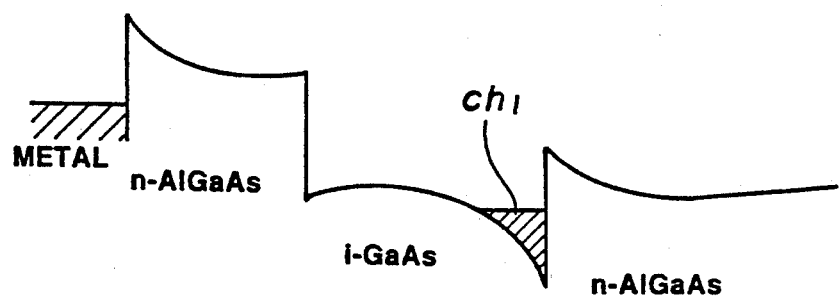
FIG. 7 is a potential diagram showing the potential pattern along the line II—II in the case where a low level bias is applied to the quantum effect device of FIG. 3.
Figure 8:
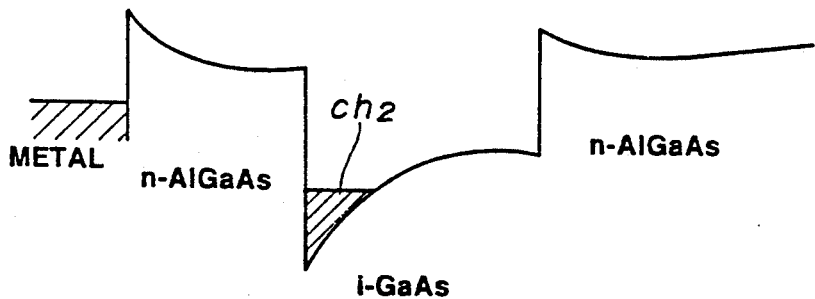
FIG. 8 is a potential diagram showing the potential pattern along the line II—II in the case where a high level bias is applied to the quantum effect device of FIG. 3.

FIGS. 7 and 8 show the potentials in the case of changing the bias voltage supplied to the control electrode 7. FIG. 7 shows the case of supply of a low level voltage to the control electrode 7, while FIG. 8 shows the case of supply of a high level voltage to the control electrode 7.

Figure 1A:
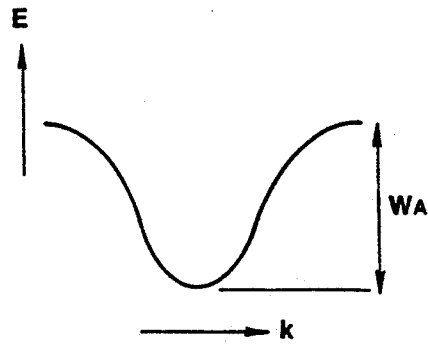
Figure 1B:
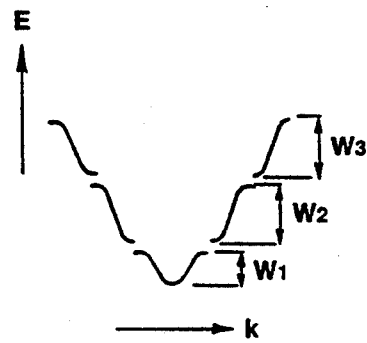
Figure 2A:
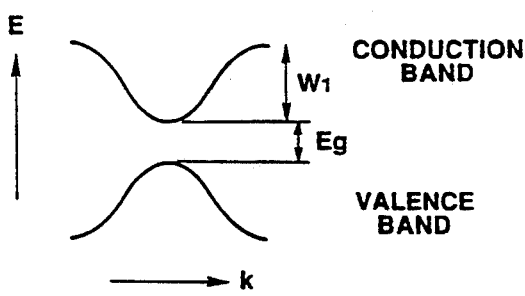

As shown in FIG. 7, in the case where the bias is made the low level, the potential falls by a large amount at the heterojunction surface of the i-GaAs layers 2 and the n-AlGaAs substrate 1, and electrons accumulate in the channel $ch_1$ formed as a result. That is, under low bias conditions, the tunnel electrons pass through the low barrier height region in the potential barrier layer 8 as shown in FIG. 5, that is, along the line III—III of FIG. 3, so the probability of transition becomes relatively higher and due to the magnitude of the amplitude of transition, the subband width becomes wide. That is, as shown in FIG. 2a, the band gap Eg becomes narrower. Therefore, when the quantum effect device of the embodiment is applied to an LED, long wavelength light emission of a relatively low energy can be obtained.

Figure 2B:
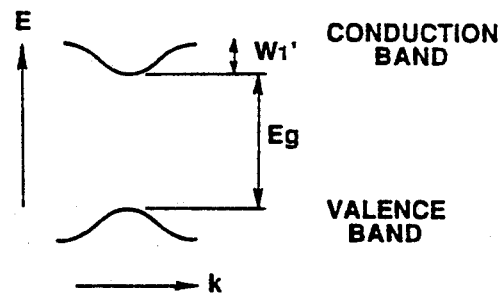

On the other hand, as shown in FIG. 8, when the bias is made a high level, the potential falls by a large amount at the heterojunction surface of the i-GaAs layers 2 and the n-AlGaAs layers 3, and electrons accumulate in the channel $ch_2$ formed as a result. When the channel $ch_2$ is used, the tunnel electrons pass through the high barrier height region in the potential barrier layer 8 as shown in FIG. 6, that is, along the line IV—IV of FIG. 3, so the probability of transition becomes relatively lower and due to the magnitude of the amplitude of transition, the subband width becomes narrow. That is, as shown in FIG. 2b, the band gap Eg becomes larger. Therefore, when the quantum effect device of the embodiment is applied to an LED, short wavelength light emission of a relatively high energy can be obtained.

In this way, in the quantum effect device of the present invention, it is possible to change the probability of tunnel transition between quantum dots by the electric field applied from the control electrode 7, so it is possible, for example, to construct a semiconductor laser etc. with a variable light emission wavelength.

Next, an explanation will be given of the steps of manufacture of the above-mentioned quantum effect device while referring to FIGS. 9 to 13.

Figure 9:
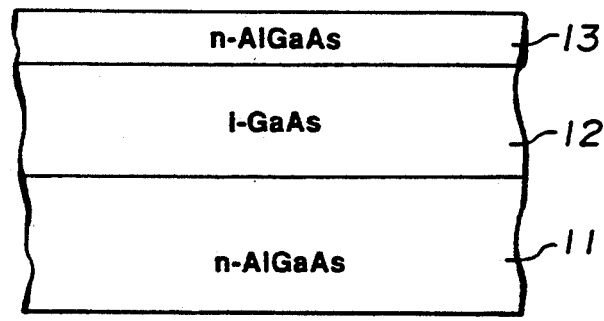
FIG. 9 is a schematic sectional view of the state up to the lamination step of the n-AlGaAs in the steps for manufacturing the quantum effect device shown in FIG. 3.

First, as shown in FIG. 9, an i-GaAs layer 12 is laid on an n-AlGaAs substrate 11. Further, an n-AlGaAs layer 13 is laid on the i-GaAs layer 12. In this way, the i-GaAs layer 12 with a narrow band gap is sandwiched between the wide band gap n-AlGaAs substrate 11 and n-AlGaAs layer 13, whereby a double hetero structure is obtained.

Figure 10:
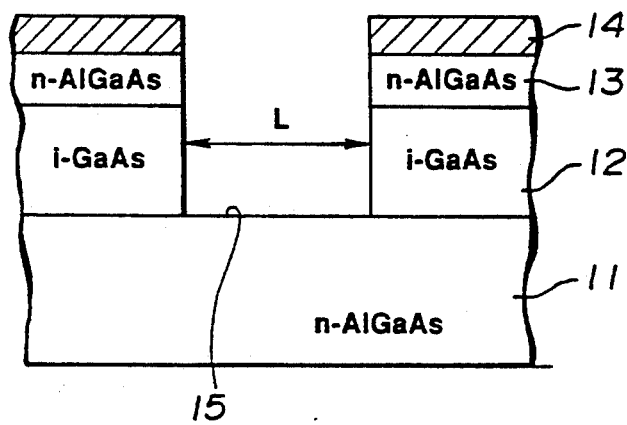
FIG. 10 is a schematic sectional view showing the state up to the step of formation of the groove.

Next, as shown in FIG. 10, the above-mentioned n-AlGaAs layer 13 and the i-GaAs layer 12 are etched and removed except at the portions serving as the blocks containing the quantum dots. That is, a mask layer 14 is formed on the n-AlGaAs layer 13 and RIE (reactive ion etching) etc. is performed in accordance with the pattern of the mask 14. The portions of the i-GaAs layer 12 remaining at this time are used to construct quantum dots for confining electrons, so the interval L of the grooves 15 formed by the etching is made about the quantum dynamic wavelength of the electrons (for example, about 10 nm). The grooves 15 are filled in by the tunnel layer, that is, the potential barrier layer, in a later step.

Figure 11:
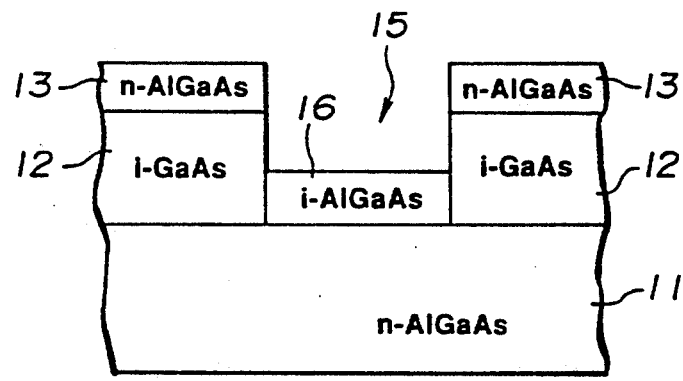
FIG. 11 is a schematic sectional view showing the state up to the step of forming the i-AlGaAs layer.

After the grooves 15 are formed by etching, as shown in FIG. 11, an i-AlGaAs layer 16 is grown on the n-AlGaAs substrate 11 at the bottom of the grooves 15. This i-AlGaAs layer 16 constitutes a tunnel layer having a relatively low barrier height and a relatively high probability of tunnel transition. The thickness of the i-AlGaAs layer 16 is made about half that of the i-GaAs layers 12, for example.

Figure 12:
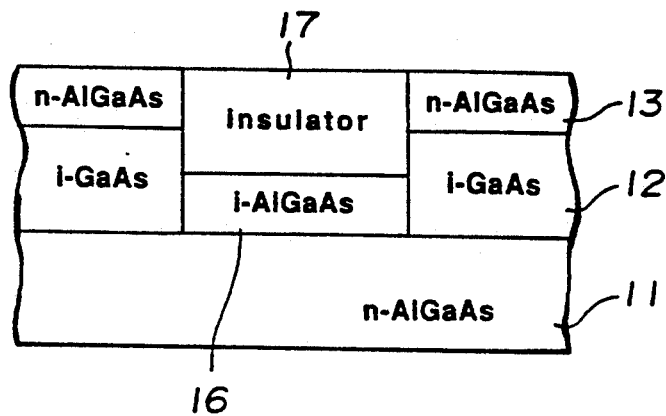
FIG. 12 is a schematic sectional view showing the state up to the step of forming the insulating layer.

Next, after formation of the i-AlGaAs layer 16, as shown in FIG. 12, the top of i-AlGaAs layer 16 is buried under an $SiO_2$ or other insulating layer 17. This insulating layer 17 may be formed by depositing an $SiO_2$ or other material layer over the entire surface of the wafer by CVD etc. and etching back until the top surfaces of the n-AlGaAs layers 13 is exposed. This makes the surface of the quantum effect device flat and smooth. The insulating layer 17 provides a tunnel layer having a relatively high barrier height and a relatively low probability of tunnel transition.

The potential barrier layer separating the quantum dots, that is, the i-AlGaAs layers 12, is formed by the i-AlGaAs layer 16 and the insulating layer 17 in this way.

Figure 13:
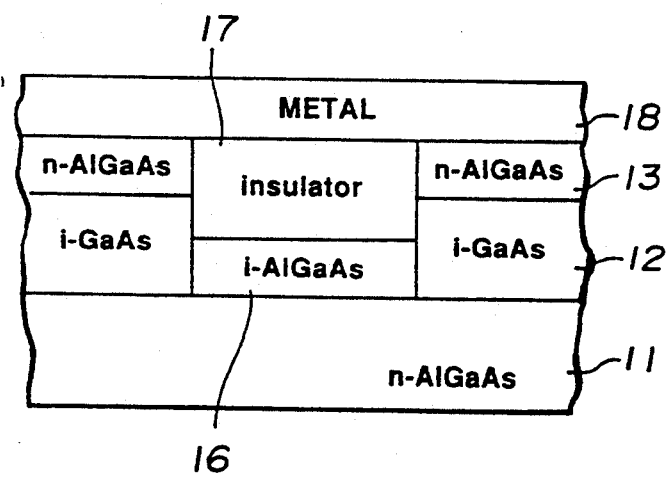
FIG. 13 is a schematic sectional view showing the state up to the step of forming the control electrode.

Next, as shown in FIG. 13, a control electrode 17 is formed over the region where the quantum dots are formed. The bias voltage supplied to the control electrode 17 is used to switch the channels in which the tunnel electrons flow and as a result the probability of tunnel transition of the electrons is controlled and the quantum effect device of the embodiment operates.

Note that in the above-mentioned embodiment, the explanation was made of the case of formation of the blocks in substantially dice shapes and formation of so-called quantum dots, but if the blocks are formed as lines, a so-called quantum wire structure which confines the electrons in only the two-dimensional directions is realized.

Further, in the above quantum effect device, use was made of an AlGaAs/GaAs type compound semiconductor, but for example it is also possible to use an InP or other type of compound semiconductor. Further, in this embodiment, the height of the potential barrier was changed at the i-AlGaAs layer and the insulating layer, but the height of the potential barrier may also be adjusted by changing the ratio of content of the Al and the Ga in the AlGaAs. Further, in this embodiment, two channels were switched between in accordance with the bias applied to the control electrode, but it is also possible to switch among three or more channels by the bias. Also, it is possible to control the local probability of tunnel transition by dividing the control electrode into parts, which can contribute to the fabrication of epochmaking, hithertofore unknown devices.

We claim:

1. A quantum effect structure comprising, a semiconductor substrate:
    a plurality of quantum dots arrayed on said semiconductor substrate;
    a potential barrier surrounding said quantum dots;
    an electron supply layer on said quantum dots; and
    an electrode on said electron supply layer;
    wherein said potential barrier is divided into two regions which have different potential barrier heights;
    each of said plurality of quantum dots having two channels connecting with each region of said potential barrier; and
    said semiconductor substrate and said electron supply layer supplying electrons to said quantum dots.

2. A quantum effect structure according to claim 1 wherein said two channels is formed by a two dimension electron gas layer.

3. A quantum effect structure according to claim 1; wherein said quantum dots sandwiched between said semiconductor substrate and said electron supply layer, and said quantum dots and said semiconductor substrate and said electron supply layer form a double heterojunction structures.

4. A quantum effect structure according to claim 1, wherein said electrode for applying an electric field to said quantum dots and a probability of tunnel transition between said quantum dots is changed by control of said electric field.

5. A quantum effect structure according to claim 1, wherein the change of said probability of tunnel transition is obtained due to a change of a light emission wavelength.

6. A quantum effect structure according to claim 1, wherein said quantum effect structure is formed within a channel region of a semiconductor transistor.

7. A quantum effect structure comprising, a semiconductor substrate;
    a plurality of quantum wires arrayed on said semiconductor substrate;
    a potential barrier surrounding said quantum wires;
    an electron supply layer on said quantum wires; and
    an electrode on said electron supply layer;
    wherein said potential barrier is divided into two regions which have different barrier heights, said quantum wire having two channels connected to each region of said potential barrier, and
    said semiconductor substrate and said electron supply layer supplying electrons to said quantum wires.

8. A quantum effect structure according to claim 7, wherein said two channels are formed by a two dimension electron gas layer.

9. A quantum effect structure according to claim 7, wherein said quantum wires are sandwiched between said semiconductor substrate and said electron supply layer, and said quantum wires and said semiconductor substrate and said electron supply layer form double heterojunction structures.

10. A quantum effect structure according to claim 7, where the change of the probability of tunnel transition is obtained by a change of the light emission wavelength.

11. A quantum effect structure according to claim 7 wherein said electrode applies an electric field to said quantum wires and the probability of tunnel transition between said quantum wires is changed by control of said electric field.

12. A quantum effect structure according to claim 7 wherein said quantum effect structure is formed within a channel region of a semiconductor transistor.

* * * * *